United States Patent [19]

Suh et al.

[11] Patent Number: 5,677,264
[45] Date of Patent: Oct. 14, 1997

[54] PROCESS FOR FORMING A-AXIS ORIENTED SUPERCONDUCTING JUNCTION

[75] Inventors: Jeong-Dae Suh; Gun-Yong Sung, both of Daejeon, Rep. of Korea

[73] Assignee: Electronics & Telecommunications Research Institute, Daejeon, Rep. of Korea

[21] Appl. No.: 693,673

[22] Filed: Aug. 13, 1996

[30] Foreign Application Priority Data

Dec. 18, 1995 [KR] Rep. of Korea .................. 95-51469

[51] Int. Cl.[6] .................................................. H01L 39/24
[52] U.S. Cl. .................. 505/329; 505/474; 505/190; 505/238; 505/702; 427/62
[58] Field of Search .................................. 505/329, 474, 505/190, 702, 238; 427/62

[56] References Cited

U.S. PATENT DOCUMENTS 5,292,718  3/1994  Tanaka et al. .
5,364,836  11/1994  Dynes et al. .

FOREIGN PATENT DOCUMENTS 07-074404  3/1995  Japan .

OTHER PUBLICATIONS

Brorsson et al, J. Appl. Phys. 75(2) Jan. 1994, pp. 827–834.
Matsubara et al, Jpn. J. Appl. Phys., Part 2, 32(9B) LI324–LI327, 1993.

Primary Examiner—Roy V. King
Attorney, Agent, or Firm—Antonelli, Terry, Stout & Kraus, LLP.

[57] ABSTRACT

The present invention discloses a process for forming an a-axis superconducting junction by adjusting the deposition temperature of an oxide normal conductor layer/and oxide superconductor layer/an oxide insulating layer/an oxide normal conductor layer/and an oxide superconductor layer, which are sequentially multilayered on an oxide single crystalline substrate. According to the present invention, the oxide superconductor layer and the oxide insulating layer have an a-axis oriented perpendicularly, and the oxide normal conductor layer have a b-axis oriented perpendicularly, so that a superconductor Josephson junction may be obtained.

8 Claims, 5 Drawing Sheets

PROCESS FOR FORMING A-AXIS ORIENTED SUPERCONDUCTING JUNCTION

BACKGROUND OF THE INVENTION

1. Field of the Invention

The present invention relates to a process for forming an oxide superconducting junction. More specifically, the present invention relates to a process for forming a perpendicular superconducting junction having a structure of oxide normal conductor layer/oxide superconductor layer/oxide insulating layer/oxide normal conductor layer/and oxide superconductor layer, each layer being laminated to a substrate in that order.

2. Description of the Prior Art

One of the general applications of an oxide superconductor layer to an electric element is the formation of a superconducting Josephson junction.

Among a variety types of superconducting Josephson junctions which have been suggested, the tunnel type Josephson junction is the simplest one.

The tunnel type Josephson junction has multi-layer structure in which a non-superconducting barrier layer is inserted between a pair of superconductor layers in a sandwich.

In general, the preparation of superconducting tunnel type Josephson junction comprises the steps of depositing a first superconductor layer on a substrate, depositing a barrier layer thereon, and sequentially depositing a second superconductor layer thereon.

The superconducting tunnel type Josephson junction includes a junction of superconductor/insulator/superconductor junction (here-in-after, referred to as "S-I-S") in which a non-superconducting insulator is used as a barrier layer, and superconductor/normal conductor/superconductor junction (here-in-after, referred to as "S-N-S") in which a normal conductor is used as a barrier layer.

The conventional superconductor junction having S-I-S junction as mentioned above is disclosed in U.S. Pat. No. 5,292,718.

The conventional superconductor junction is prepared by forming a first oxide superconductor layer on a substrate, forming a non-superconducting intermediate layer made of MgO, and then forming a second oxide superconductor layer in that order.

The preparation of the S-I-S junction comprises preheating of the substrate at 600°–650° C. under an oxygen atmosphere for at least 5 minutes, and depositing the non-superconducting intermediate layer at 200°–400° C. As the first oxide superconductor layer, $YBa_2Cu_3O_{7-x}$ (herein-in-after, referred to as YBCO) is deposited by a vacuum evaporation method, and the substrate is heated at a temperature of 600°–630° C. in order for the crystal orientation of YBCO to be a- or c-axis. The non-superconducting intermediate layer is formed by depositing MgO in a thickness of 3 nm on the substrate heated to 400° C., by using a vacuum evaporation method. The second oxide superconductor layer is formed in a thickness of 200 nm by heating the base plate at a temperature of 630° C., by using a vacuum evaporation method. The conventional superconductor junction formed by the process has a multilayered structure in which YBCO/MgO/YBCO is laminated in that order.

A S-I-S junction in which MgO and $PrGaO_3$ oxide is inserted as a barrier layer between a pair of a-axis oriented YBCO superconductor layers has been disclosed in the literatures: M. Mukaida et al., Jap. J. Appl. Phys., Vol.33, 2521 (1994); and S. Tanaka et al., U.S. Pat. No. 5,292,718 (1994).

Oxide superconductors are characterized in that they have different superconducting coherence length depending on the crystal axis, due to the anisotropy of crystal structure.

For example, a YBCO oxide superconductor is ten-times as long in a coherence length in a-axis direction as compared to a c-axis direction.

Thus, in view of coherence length of a superconductor, an a-axis oriented YBCO oxide superconductor layer is advantageous in the preparation of tunnel type Josephson junction, as compared to a c-axis oriented YBCO oxide superconductor layer.

As a conventional a-axis oriented superconductor junction, an S-N-S junction in which a non-superconductor $PrBa_2Cu_3O_{7-x}$ (here-in-after, referred to as "PBCO") barrier layer is inserted between a pair of a-axis oriented YBCO superconductor layers as is disclosed in the literatures: J. B. Barmer et al., Appl. Phys. Lett., 59(6), 742(1991); T. Hashimoto et al., Appl. Phys. Lett., 60(14), 1756(1992); T. Umezawa et al., Appl. Phys. Lett., 63(23), 3221(1993).

The conventional a-axis oriented superconductor junction has disadvantages as follows:

Firstly, in the case of a-axis perpendicularly oriented S-I-S junction, when a non-superconductive oxide insulating layer is inserted between the first superconductor layer and the second superconductor layer to have a direct contact to the superconductor layer, the crystallinity is reduced by the difference of the lattice constant and thermal expansion coefficient of the insulating layer and superconductor layer. In particular, the superconductivity of the first and the second YBCO superconductor layer is lowered due to the difference of the insulating layer and superconductor layer.

In particular, the temperature where the resistance becomes zero and superconductivity occurs is lowered to 77K or less.

Secondly, in case of an a-axis oriented S-N-S junction, when the a-axis oriented superconductor layer is deposited on an $SrTiO_3$, MgO single crystalline substrate having a cubic structure, the directions of b-axis and c-axis of the a-axis oriented superconductor layer cannot align in a certain direction.

SUMMARY OF THE INVENTION

The object of the present invention is to overcome the above mentioned problems and to provide a process for forming an a-axis oriented superconductor junction having a multilayered structure of an oxide superconductor layer/non-superconductor layer, which comprises laminating sequentially a first oxide normal conductor layer, a first superconductor layer, an oxide insulating layer, a second oxide normal conductor layer and a second superconductor layer on an oxide single crystalline substrate.

The process according to the present invention comprises the steps of heat treating an oxide single crystalline substrate at 800°–850° C.; forming a first oxide normal conductor layer on the base plate at 630°–650° C.; forming a first superconductor layer on the first oxide normal conductor layer at 750°–770° C.; forming an oxide insulating layer on the first superconductor layer at 550°–600° C.; forming a second oxide normal conductor layer on the oxide insulating layer at 630°–650° C.; and forming a second oxide superconductor layer on the second normal conductor layer at 750°–770° C.

DETAILED DESCRIPTION OF THE INVENTION

Figure 1:
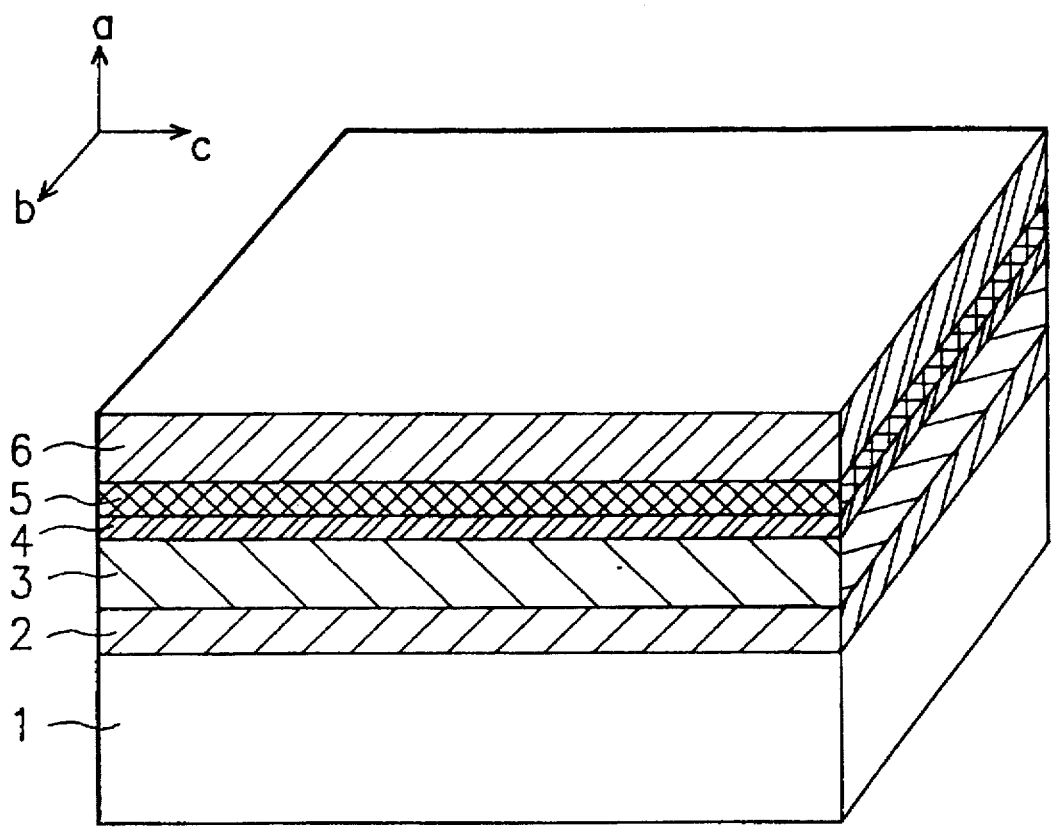
FIG. 1 is a sectional view of a-axis oriented superconductor junction having a multilayered structure of an oxide superconductor layer/non-superconductor layer, according to the present invention.

Now, the present invention is described by referring to the drawings.

FIG. 1 is a sectional view of a-axis oriented superconductor junction having a multilayered structure of an oxide superconductor layer/non-superconductor layer, according to the present invention.

As referring to FIG. 1, the a-axis oriented superconductor junction having a multilayered structure of an oxide superconductor layer/non-superconductor layer according to the present invention has a structure in which a first oxide normal conductor layer (2), a first superconductor layer (3), an oxide insulating layer (4), a second oxide normal conductor layer (5) and a second superconductor layer (6) are sequentially deposited on an oxide single crystalline substrate (1).

FIGS. 2A to 2E are sectional views showing the process for forming the a-axis oriented superconductor junction having multilayered structure of oxide superconductor layer/non-superconductor layer, according to the present invention.

First, an oxide single crystalline substrate (1) is heat treated from room temperature to 800° to 850° C.

The heat treatment is performed to clean and smooth the surface of the oxide single crystalline substrate (1). As oxide single crystalline substrate (1), $PrGaO_3$ (PGO) or $LaSrGaO_4$ (LSGO) having (100) crystal orientation is used.

The temperature of the oxide single crystalline substrate (1) is 800°–850° C., and the rate of temperature rise is 30° C./min. The heat treatment is carried out under a vacuum condition of less than $10^{-5}$ Torr for 30–60 minutes.

Figure 2A:
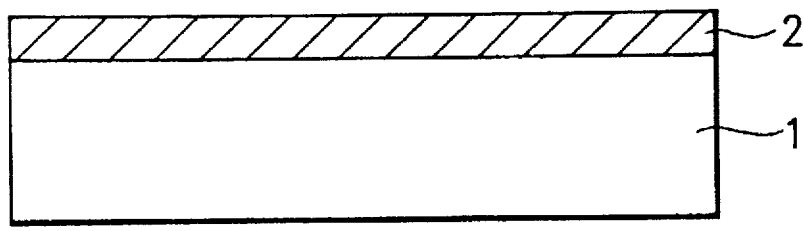
FIGS. 2A, 2B, 2C, 2D and 2E are sectional view; showing the process for forming the a-axis oriented superconductor junction having multilayered structure of an oxide superconductor layer/non-superconductor layer, according to the present invention.

Then, as illustrated in FIG. 2A, the first non-superconductor layer (2) is deposited onto the oxide single crystalline substrate (1) by using a pulse laser deposition method.

As the first normal conductor layer, PBCO layer is preferably used. The deposition is performed in order for the b-axis direction to be perpendicular to the substrate.

The deposition conditions are as follows: temperature of the substrate is 630°–650° C.; depositing oxygen pressure is 100 mTorr; pulse laser incidence energy is 1 J/cm²; pulse laser incidence ratio is 1 Hz; and thickness of the layer is 100 nm.

Figure 2B:
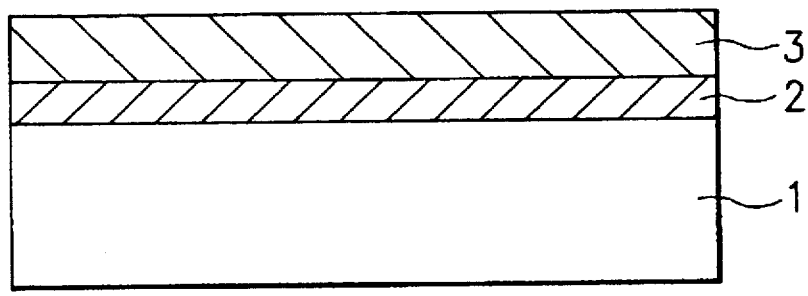

Then, as can be illustrated in FIG. 2B, after raising the temperature of the oxide single crystalline substrate (1) to 750°–770° C., an a-axis oriented YBCO (as the first superconductor layer (3)) is deposited on the first non-superconductor layer (2) by using an excimer pulse laser deposition method.

The deposition conditions of the first superconductor layer (3) is as follows: deposition oxygen pressure: 100 mTorr, pulse laser incidence energy is 1 J/cm², pulse laser incidence repetition rate is 1 Hz, and the thickness of the layer is 300 nm.

Figure 3:
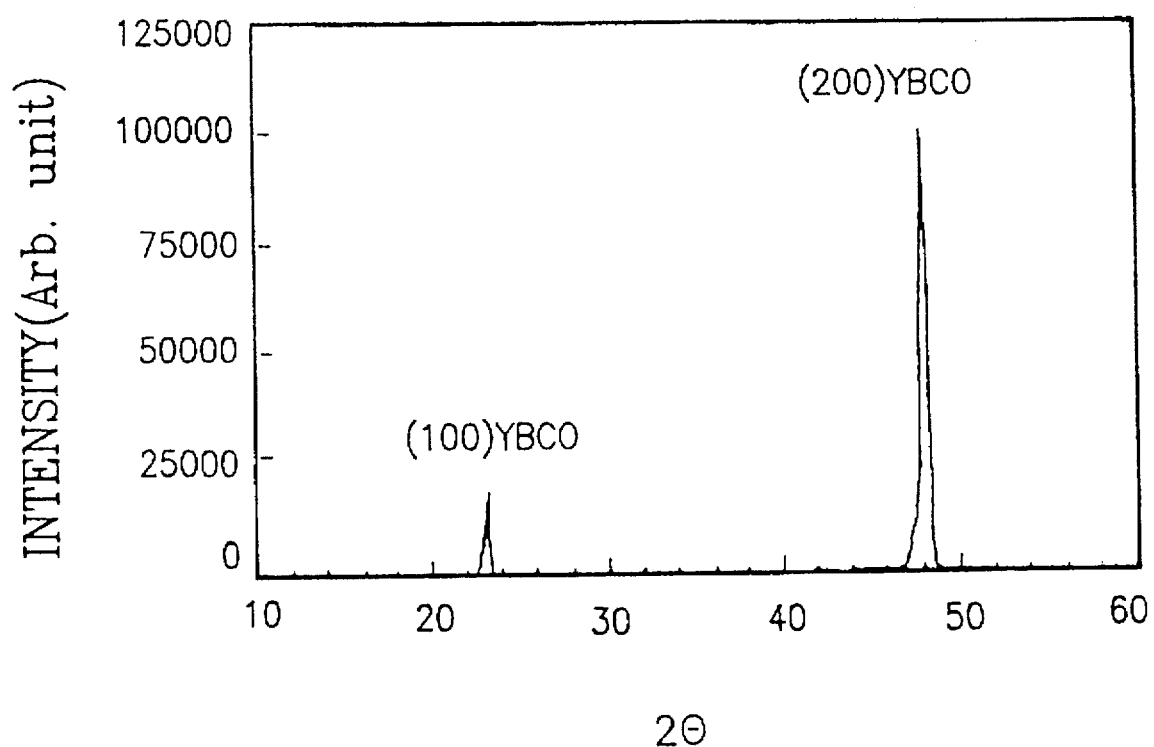
FIG. 3 is a X-ray diffraction diagram of a first a-axis oriented YBCO oxide superconductor layer of FIG. 1.

The crystalline direction of the first superconductor layer (3), as can be seen in FIG. 3, is a-axis oriented.

Figure 2C:
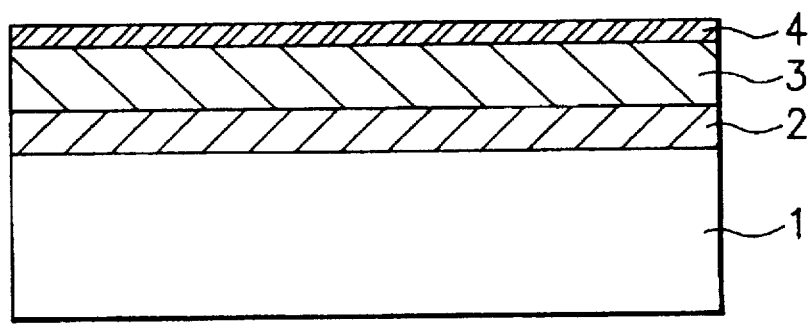

Then, as illustrated in FIG. 2C, the deposition conditions of the oxide single crystalline substrate (1) are: 550°–600° C., depositing oxygen pressure of 100 mTorr, pulse laser incidence energy of 1 J/cm² and pulse laser incidence repetition rate 1 Hz, the oxide insulating layer (4) having thickness of 5–200 nm is deposited on the first superconductor layer (3) by using the pulse laser deposition method.

The oxide insulating layer (4) is PGO, LSGO, LSAO ($LaSrAlO_4$), and has a-axis orientation.

Figure 2D:
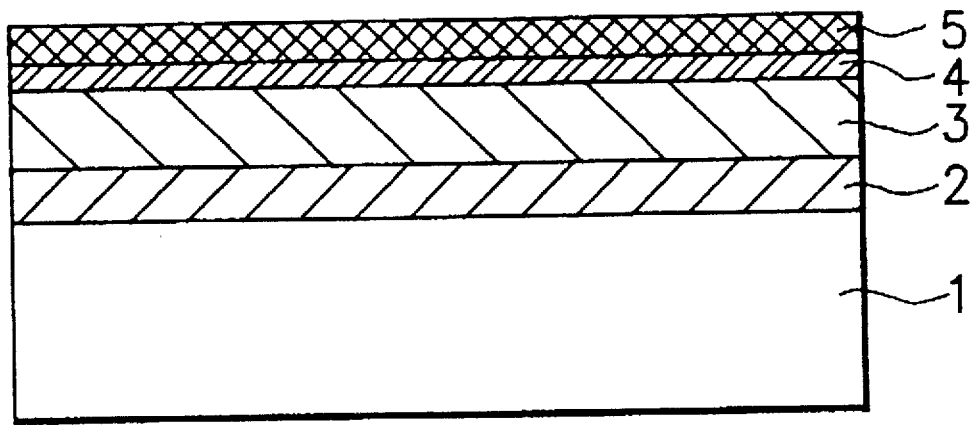

Then, as illustrated in FIG. 2D, the temperature of the oxide single crystalline substrate (1) is adjusted to 630°–650° C., and b-axis oriented PBCO [as the second oxide normal conductor layer (5)] is deposited in a thickness of 15–30 nm onto the oxide insulating layer (4) by using an excimer pulse laser deposition method.

The deposition conditions of the second normal conductor layer (5) are: depositing oxygen pressure of 100 mTorr, pulse laser incidence energy of 1 J/cm² and pulse laser incidence repetition rate of 1 Hz.

Figure 2E:
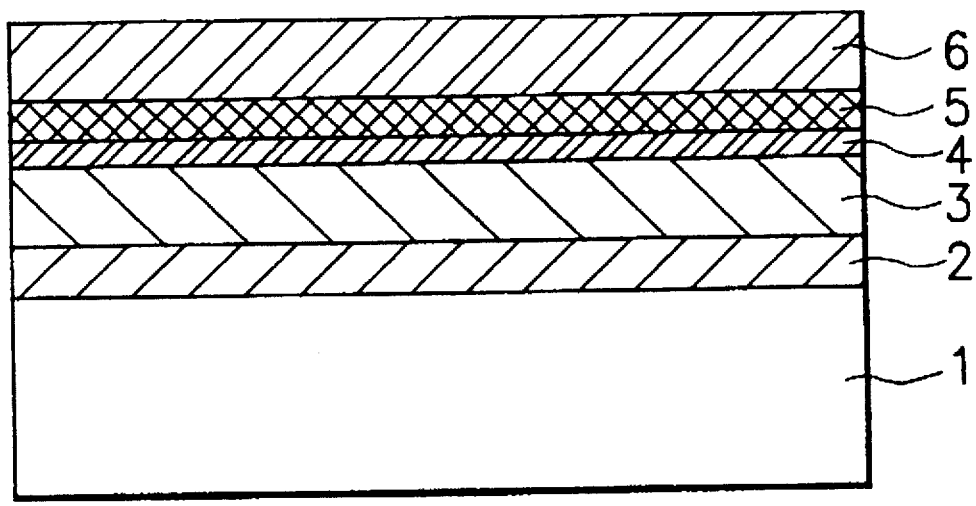

Finally, as shown in FIG. 2E, the temperature of the oxide single crystalline substrate (1) is raised to 750°–770° C., and a-axis oriented YBCO [as the second oxide superconductor layer (6)] is deposited onto the second oxide normal conductor layer (5) by using a pulse laser deposition method.

The deposition conditions of the second oxide superconductor layer (6) are the same as those of the first oxide superconductor layer (3).

Figure 4:
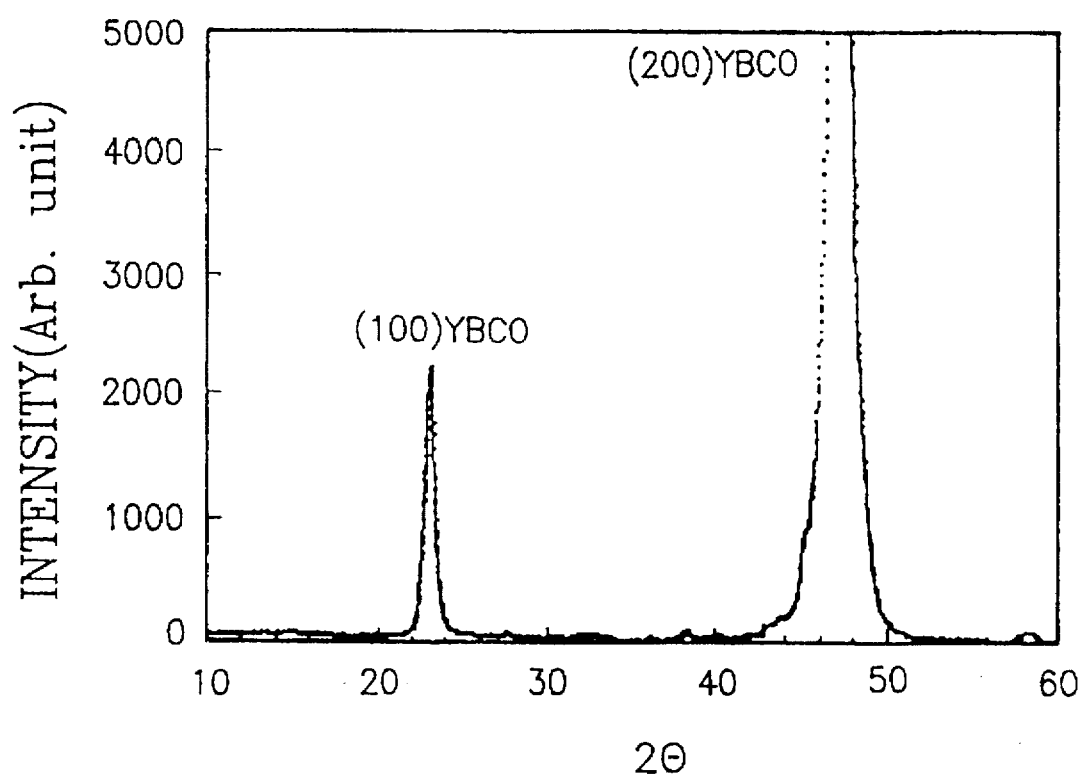
FIG. 4 is a X-ray diffraction diagram of a second a-axis oriented YBCO oxide superconductor layer of FIG. 1.

The second oxide superconductor layer (6) is a-axis oriented (1), as illustrated in FIG. 4, the X-ray diffraction diagram.

The first characteristic of the present invention is to deposit the first oxide normal conductor layer (2) on LSGO oxide single crystalline substrate (1) at a temperature of 630°–650° C.

The growth of b-axis of the first oxide normal conductor layer (2) perpendicular to the surface of the substrate (b-axis perpendicular orientation), and the alignment of a-axis and c-axis in a direction parallel to the surface of the substrate (alignment of a-axis and c-axis in one direction) are determined by the temperature of the substrate; and the a-axis orientation and the alignment of b-axis and c-axis in one direction of the first superconductor layer (3) [which is sequentially deposited thereon] is determined by lattice constant and surface morphology of the first oxide normal conductor layer.

If the first oxide normal conductor layer is deposited at a temperature lower than 630° C. and then the first oxide superconductor layer (3) is deposited thereon, the first oxide superconductor layer has a-axis orientation, however, the alignment of b-axis and c-axis in one direction cannot be obtained.

On the other hand, if the first oxide normal conductor layer (2) is deposited at a temperature higher than 650° C. and then the first superconductor layer (3) is deposited thereon, the first superconductor layer has a c-axis orientation.

If the first superconductor layer (3) is deposited at a substrate temperature of 630°–650° C. and the first superconductor layer (3) is deposited thereon, the first superconductor layer is a-axis oriented and b-axis and c-axis are aligned in one direction.

The second characteristic of the present invention is to deposit LSGO oxide insulating layer at a substrate temperature of 550°–600° C.

The orientation of the LSGO insulating layer (4) is determined by the temperature of the substrate, and the orientation of the second normal conductor layer (5) and the second superconductor layer (6) [which are sequentially deposited thereon] is also determined.

After the sequential growth of the first normal conductor layer (2) having a b-axis orientation and the first superconductor layer (3) having an a-axis orientation, if LSGO insulating layer (4) is deposited at a substrate temperature of lower than 550° C., an insulating layer grows in a noncrystalline manner, and the second normal conductor layer (5) and the second superconductor layer (6) grows in a polycrystalline manner.

On the other hand, if LSGO insulating layer (4) is deposited at a substrate temperature of higher than 600° C., the second normal conductor layer (5) and the second superconductor layer (6) grows in c-axis orientation.

Thus, in both cases, an a-axis oriented superconductor junction cannot be obtained.

The third characteristic of the present invention is to deposit the second normal conductor layer (5) in a thickness of 15–30 nm.

If the thickness of the second conductor layer (5) is less than 15 nm, the second superconductor layer (6) [which is deposited thereon] has a c-axis orientation.

On the other hand, if the thickness is more than 30 nm, the second superconductor layer (6) [which is deposited thereon] has a-axis orientation, however, a superconducting junction suitable for the superconducting coherence length can not be obtained.

According to the process for forming a junction described above, the present invention has effects as follows:

First, a superconducting multi-layer structure having a-axis perpendicular orientation can be obtained.

Second, a multi-layer structure in which a b-axis and a c-axis of the a-axis oriented first and second superconductor layer (3,6) are parallel to the oxide single crystalline substrate and aligned in a certain direction can be obtained.

Third, an a-axis oriented superconducting junction having superconductivity at a temperature not lower than 77K can be obtained.

Fourth, an a-axis oriented superconducting tunnel type Josephson junction, which is essential to the application in the field of a superconducting electronic device can be obtained.

What is claimed is:

1. A process for forming an a-axis oriented superconducting junction comprising the steps: of heat treating an oxide single crystalline substrate at 800°–850° C.; forming a first oxide normal conductor layer on the heat treated substrate at 630°–650° C.; forming a first oxide a-axis oriented superconductor layer on the first oxide normal conductor layer at 750°–770° C.; forming an oxide insulating layer on the first oxide a-axis oriented superconductor layer at 550°–600° C.; forming a second oxide normal conductor layer on the oxide insulating layer at 630°–650° C.; and forming a second oxide a-axis oriented superconductor layer on the second normal conductor layer at 750°–770° C.

2. A process for forming an a-axis oriented superconducting junction according to claim 1, wherein the first oxide normal conductor layer, the first oxide a-axis oriented superconductor layer, the oxide insulating layer, the second normal conductor layer and the second oxide a-axis oriented superconductor layer are formed by an excimer pulse laser deposition method.

3. A process for forming an a-axis oriented superconducting junction according to claim 1, wherein the oxide single crystalline substrate is made of $PrGaO_3$ or $LaSrGaO_4$.

4. A process for forming an a-axis oriented superconducting junction according to claim 1, wherein the oxide insulating layer is made of one material selected from the group consisting of $PrGaO_3$, $LaSrGaO_4$ and $LaSrAlO_4$.

5. A process for forming an a-axis oriented superconducting junction according to claim 1, wherein the first and the second normal conductor layers are made of $PrBa_2Cu_3O_{7-x}$.

6. A process for forming an a-axis oriented superconducting junction according to claims 1 or 5, wherein the first and the second normal conductor layers are formed in a b-axis perpendicular orientation.

7. A process for forming an a-axis oriented superconducting junction according to claim 1, wherein the first and the second superconductor layers are made of $YBa_2CU_3O_{7-x}$.

8. A process for forming an a-axis oriented superconducting junction according to claims 1 or 7, wherein the orientation of a b-axis and a c-axis of the first and the second superconductor oxide layers are aligned in a direction parallel to a surface of a single crystalline substrate.

* * * * *